United States Patent [19]

Nakamura et al.

[11] Patent Number: 5,547,530

[45] Date of Patent: Aug. 20, 1996

[54] METHOD OF MANUFACTURING A CERAMIC SUBSTRATE

[75] Inventors: Yoshifumi Nakamura, Neyagawa; Yoshihiro Bessho, Higashiosaka; Satoru Yuhaku, Osaka; Yasuhiko Hakotani, Nishinomiya; Minehiro Itagaki, Moriguchi; Kazuhiro Miura, Osaka, all of Japan

[73] Assignee: Matsushita Electric Industrial Co., Ltd., Kadoma, Japan

[21] Appl. No.: 189,482

[22] Filed: Jan. 31, 1994

[30] Foreign Application Priority Data

Feb. 2, 1993 [JP] Japan ................................. 5-015203

[51] Int. Cl.⁶ ..................... B32B 31/04; B32B 31/12; B32B 31/24; C04B 41/81
[52] U.S. Cl. ..................... 156/89; 156/247; 264/61; 264/63; 29/851; 427/58; 427/96; 437/183
[58] Field of Search .................... 156/89, 232, 233, 156/247; 29/831, 851; 264/61; 437/183; 427/58, 125, 126.2, 126.3, 96

[56] References Cited

U.S. PATENT DOCUMENTS

| | | | |
|---|---|---|---|
| 4,461,077 | 7/1984 | Hargis | 264/61 X |
| 5,085,720 | 2/1992 | Mikeska et al. | 156/89 |
| 5,093,986 | 3/1992 | Mandai et al. | 29/843 |
| 5,130,067 | 7/1992 | Flaitz et al. | 264/60 |
| 5,135,595 | 8/1992 | Acocella et al. | 156/89 |

FOREIGN PATENT DOCUMENTS

| | | |
|---|---|---|
| 0464224 | 1/1992 | European Pat. Off. . |
| 61-188942 | 8/1986 | Japan . |
| 1-293539 | 11/1989 | Japan . |
| 292936 | 7/1990 | Japan . |
| 3112191 | 5/1991 | Japan . |
| 5218133 | 8/1993 | Japan . |

OTHER PUBLICATIONS

Search Report for European Appl. 94101559.6, mailed Nov. 22, 1994.

*Primary Examiner*—David A. Simmons
*Assistant Examiner*—M. Curtis Mayes
*Attorney, Agent, or Firm*—Renner, Otto, Boisselle & Sklar

[57] ABSTRACT

The method of manufacturing a ceramic substrate having a plurality of bumps of the present invention, includes the steps of: forming a bump forming layer having a plurality of holes therein on at least one of upper and lower faces of a laminated body of green sheets; filling the holes in the bump forming layer with a bump forming paste; sintering the laminated body of the green sheets and the bump forming paste; and forming bumps made of the sintered bump forming paste by removing the bump forming layer.

26 Claims, 3 Drawing Sheets

METHOD OF MANUFACTURING A CERAMIC SUBSTRATE

BACKGROUND OF THE INVENTION

1. Field of the Invention

The present invention relates to a ceramic substrate whereon semiconductor devices, LSIs and component chips are mounted, and a method to manufacture thereof.

2. Description of the Related Art

A Ceramic chip carrier substrate of the prior art has a plurality of external connection pads on each of the four side faces thereof. These external connection pads are formed to extend from the side face to the bottom of the substrate. Recently, ceramic substrates having bumps arranged in a grid configuration on the bottom face for external connection have been put into use. Such ceramic chip carriers can be mounted in high density on a printed circuit board.

Ceramic chip carriers are mounted on a printed circuit board (mother board) in such a procedure as described below. Solder paste is printed onto specified terminals provided on a printed circuit board. Ceramic chip carriers are arranged on the printed circuit board so that the external connection terminals provided on the bottom face of the ceramic chip carrier are placed on the terminals with the solder paste printed thereon. Then the solder is reflowed so that the external connection terminals provided on the bottom face of the ceramic chip carrier are soldered onto the specified terminals provided on the printed circuit board.

External connection bumps of the conventional ceramic chip carrier have been formed after the manufacture of the ceramic substrate. This procedure results in a problem of high manufacturing cost of the ceramic chip carrier. Also in the procedure of forming each of the plurality of external connection bumps one by one, there has been a problem of variations being caused in the height, size and configuration of the external connection bumps. Deviation in the height of the external connection bumps is likely to cause connection failure between bumps of smaller height and the printed circuit board.

Moreover, there has been no method available to form the external connection bumps having sufficient height. As a result, there has been a problem in that the substrate of the ceramic chip carrier and the printed circuit board are brought too close to each other, causing solder bridges in the solder reflowing process which result in short-circuiting between the electrodes. There also has been a problem of joints being broken due to thermal stress, when the ceramic chip carrier substrate and the printed circuit board whereon the ceramic chip carriers are mounted have different thermal expansion coefficients.

As a solution to the problem of solder bridge, the Japanese Laid-Open Patent Publication No. 61-188942 discloses a method of preventing the solder bridge by providing a blocking means made of an electrically insulating material around the soldered Joints. However, this method results in a complicated structure and a problem of high manufacturing cost.

SUMMARY OF THE INVENTION

The method of manufacturing a ceramic substrate having a plurality of bumps of the present invention, includes the steps of: forming a bump forming layer having a plurality of holes therein on at least one of upper and lower faces of a laminated body of green sheets; filling the holes in the bump forming layer with a bump forming paste; sintering the laminated body of the green sheets and the bump forming paste; and forming bumps made of the sintered bump forming paste by removing the bump forming layer.

In one embodiment of the present invention, the step of forming the bump forming layer includes the steps of: making the plurality of holes in at least one green sheet for bump forming layer; and applying the at least one green sheet for bump forming layer onto the at least one face of the laminated body of green sheets.

In another embodiment of the present invention, the above-mentioned method includes, before the sintering step, the steps of: applying heat treatment to the laminated body of green sheets and the bump forming paste in order to remove organic substances included in the laminated body of green sheets and the bump forming paste; and reducing the bump forming paste.

In another embodiment of the present invention, the green sheet for bump forming layer includes inorganic components as major components, which are not sintered at the sintering temperature of the sintering step.

In another embodiment of the present invention, the green sheet for bump forming layer includes at least one component selected from a group consisting of $Al_2O_3$, MgO, $ZrO_2$, $TiO_2$, BeO and BN.

In another embodiment of the present invention, the step of forming the bump forming layer includes the step of: printing the bump forming layer having the plurality of holes therein on the at least one face of the laminated body of green sheets by using a paste for bump forming layer.

In another embodiment of the present invention, the method further includes, before the sintering step, the steps of: applying heat treatment to the laminated body of green sheets, the bump forming paste and the paste for bump forming layer in order to remove organic substances included in the laminated body of green sheets, the bump forming paste and the paste for bump forming layer; and reducing the bump forming paste.

In another embodiment of the present invention, the method further includes, before the step of forming the bump forming layer, the step of forming a substrate forming layer on at least one face of the laminated body of green sheets by printing a paste for forming substrate.

In another embodiment of the present invention, the paste for bump forming layer includes inorganic components as major components, which are not sintered at the sintering temperature of the sintering step.

In another embodiment of the present invention, the paste for bump forming layer includes at least one component selected from a group consisting of $Al_2O_3$, MgO, $ZrO_2$, $TiO_2$, BeO and BN.

In another embodiment of the present invention, the bump forming paste is a conductive paste including at least one component selected from a group consisting of Ag, Pd, Pt and Cu.

In another embodiment of the present invention, the bump forming paste is a metal oxide paste including CuO as the major component.

In another embodiment of the present invention, the plurality of bumps each have a form of a pillar.

In another embodiment of the present invention, the method of manufacturing a ceramic substrate having a plurality of bumps includes the steps of: forming a bump forming layer having a plurality of holes therein on at least one of upper and lower faces of a ceramic substrate; filling the holes in the bump forming layer with a bump forming paste; sintering the laminated body of the green sheets and the bump forming paste; and forming bumps made of the sintered bump forming paste by removing the bump forming layer.

In another embodiment of the present invention, the step of forming the bump forming layer includes the steps of: making the plurality of holes in at least one green sheet for bump forming layer; and applying the at least one green sheet for bump forming layer onto the at least one face of the ceramic substrate.

In another embodiment of the present invention, the method further includes, before the sintering step, the steps of: applying heat treatment to the green sheet for bump forming layer and the bump forming paste in order to remove organic substances included in the green sheets for bump forming layer and the bump forming paste; and reducing the bump forming paste.

In another embodiment of the present invention, the green sheet for bump forming layer includes inorganic components as major components, which are not sintered at the sintering temperature of the sintering step.

In another embodiment of the present invention, the green sheet for bump forming layer includes at least one component selected from a group consisting of $Al_2O_3$, $MgO$, $ZrO_2$, $TiO_2$, $BeO$ and $BN$.

In another embodiment of the present invention, wherein the step of forming the bump forming layer comprises the step of: printing the bump forming layer having the plurality of holes therein on the at least one face of the ceramic substrate by using a paste for bump forming layer.

In another embodiment of the present invention, the method further includes, before the sintering step, the steps of: applying heat treatment to the bump forming paste and the paste for bump forming layer in order to remove organic substances included in the bump forming paste and the paste for bump forming layer; and reducing the bump forming paste.

In another embodiment of the present invention, the method further includes, before the step of forming the bump forming layer, the step of forming a substrate forming layer on at least one face of the ceramic substrate by printing a paste for forming substrate.

In another embodiment of the present invention, the paste for bump forming layer includes inorganic components as major components, which are not sintered at the sintering temperature of the sintering step.

In another embodiment of the present invention, the paste for bump forming layer includes at least one component selected from a group consisting of $Al_2O_3$, $MgO$, $ZrO_2$, $TiO_2$, $BeO$ and $BN$.

In another embodiment of the present invention, the bump forming paste is a conductive paste including at least one component selected from a group consisting of $Ag$, $Pd$, $Pt$ and $Cu$.

In another embodiment of the present invention, the bump forming paste is a metal oxide paste including $CuO$ as the major component.

In another embodiment of the present invention, the plurality of bumps each have a form of a pillar.

In another aspect of the present invention, the ceramic substrate has a plurality of bumps made of a sintered body of a bump forming paste.

In another embodiment of the present invention, the plurality of bumps each have a form of a pillar.

Thus, the invention described herein makes possible the advantages of (1) providing a ceramic substrate and (2) providing a method of manufacturing a ceramic substrate, wherein the solder bridge is not likely to occur and high reliability can be obtained.

These and other advantages of the present invention will become apparent to those skilled in the art upon reading and understanding the following detailed description with reference to the accompanying figures.

DESCRIPTION OF THE PREFERRED EMBODIMENTS

The present invention wall be described by way of example with reference to the accompanying drawings as follows:

EXAMPLE 1

Figure 1:
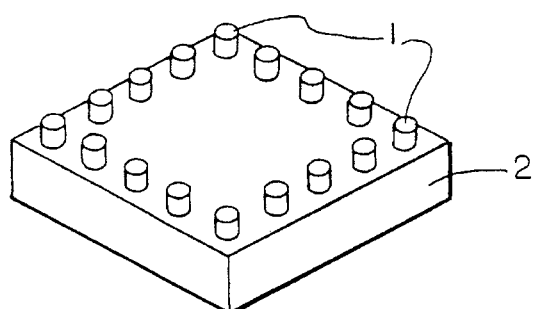
FIG. 1 is a perspective view showing a back face of a ceramic substrate of Example 1 of the invention wherein an unsintered layer for the formation of bumps has been removed.

FIG. 1 shows a view of a substrate having external connection bumps obtained in this example viewed from a perspective view from the bottom. The ceramic substrate of the invention has external connection bumps 1 which have sufficient height and are uniform in the height, configuration and size, being provided on the bottom of the substrate 2.

A method of manufacturing the ceramic substrate of the invention will first be described. While the invention wall be described taking a substrate sintered at a low temperature as an example in the following embodiments, although the invention is not limited to this scheme.

A mixture of borosilicate-lead glass powder and alumina powder as the ceramic material being mixed in a 50:50 weight ratio (MLS-19 manufactured by Nippon Electric Glass Co., Ltd.) was used for the glass-ceramic material to make the substrate. Using this glass-ceramic powder as the inorganic material, polyvinyl butyral as the organic binder, di-n-butyl phthalate as a plasticizer and toluene and isopropyl alcohol being mixed in a weight ratio of 30:70 as the solvent, a slurry was made by mixing these substances together.

The slurry was applied on an organic film to form it into a sheet by means of a doctor blade method. As an organic film, a polymer film such as PET film can be used. The organic film with the slurry being spread thereon was dried and punched into the desired size in order to obtain green sheets for the forming of substrates. Via-holes were formed as required in the substrate forming green sheet. The processes of forming the film, drying the film and making via-holes were carried out by using equipment known to those skilled in the art which performs these processes continuously.

Figure 2A:
FIGS. 2a–2f is a drawing illustrative of a process in the manufacturing method for the ceramic substrate of Example 1 of the invention.
Figure 2A:
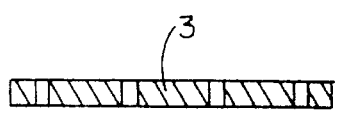
Figure 2B:
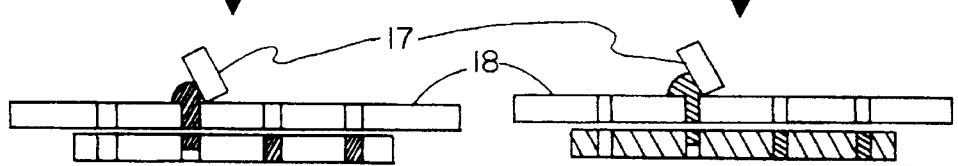
Figure 2C:
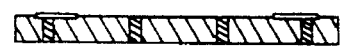
Figure 2D:
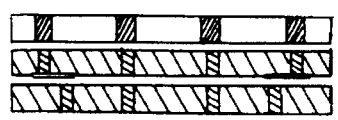
Figure 2E:
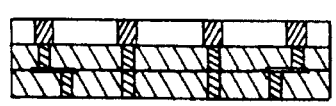
Figure 2F:

The processes will be described below with reference to FIGS. 2a–2f. FIGS. 2a–2f is a drawing illustrative of the process of manufacturing the ceramic substrate of the invention. Holes are formed in a green sheet for bump forming layer and in a substrate forming green sheet (FIG. 2a). The holes are filled using a squeegee 17 and a metal plate 18 (FIG. 2b). Wiring patterns are printed (FIG. 2c). The layers are laminated (FIG. 2d) and then sintered (FIG. e). Finally, the bump forming layer is removed (FIG. 2f). A screen printing process was employed in the printing for the formation of the substrate forming green sheet and via-hole filling in the substrate forming green sheet by using Ag paste as the conductive paste. As an inorganic component of the wiring forming Ag paste, Ag powder (mean particle size 1 μm) with 5 wt % of glass frit (GA-9 glass powder with a mean particle size of 2.5 μm, made by Nippon Electric Glass Co., Ltd.) being added thereto in order to increase the bonding strength was used. By adding PVB as the organic binder and a vehicle dissolved in terpineol to the inorganic component and mixing these materials by means of a 3-step roll, the wiring forming paste with proper viscosity was obtained. The via-hole filling Ag paste was prepared by further adding 15 wt % of the glass ceramic powder as the inorganic component to the wiring forming paste. The via-hole filing Ag paste was used as a bump forming paste.

Now the method of manufacturing the green sheet for bump forming layer will be described below. Using alumina powder (ALM-41 with a mean particle size of 1.9 μm, made by Sumitomo Chemical Co., Ltd.) as the inorganic material, with ethyl cellulose being added as the organic binder together with a vehicle dissolved in terpineol, and turned into a slurry in order to prepare the green sheet which will not be sintered for the forming of bumps. The slurry was applied onto an organic film so as to form it into a sheet by means of the doctor blade method. Holes for forming the bumps were made in the thus obtained green sheet in order to make a green sheet for forming bumps. Similarly to the case of the substrate forming green sheet, the holes made in the green sheet for bump forming layer were filled with the via-hole filling Ag paste.

Figure 3:
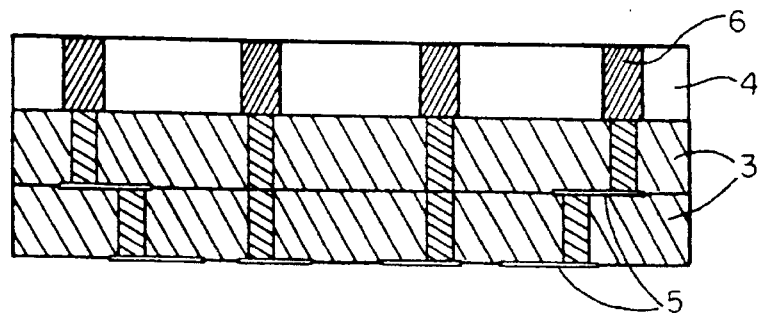
FIG. 3 is a cross sectional view of a laminated body used in the manufacture of the ceramic substrate of Example 1 of the invention.

Specified numbers of the substrate forming green sheets and the bump forming green sheets were placed one on another so that the green sheet for bump forming layer became the outermost layer, and were bonded by thermo-compression bonding so as to make a laminated body. Conditions of thermo-compression bonding were a temperature of 80° C. and a pressure of 200 kg/cm². The substrate forming green sheet and the green sheet for bump forming layer were about 200 μm thick. FIG. 3 shows the structure of the laminated body thus obtained in a cross sectional view. The laminated body comprises the substrate forming green sheet layer 3 having a wiring pattern 5 and the green sheet for bump forming layer 4 having bump electrodes 6.

Then the laminated body was placed on a substrate made of 96% alumina and was then sintered. Sintering was carried out in a belt furnace in an air atmosphere at 900° C. for one hour. The temperature of 900° C. was maintained for about 12 minutes.

Figure 4:
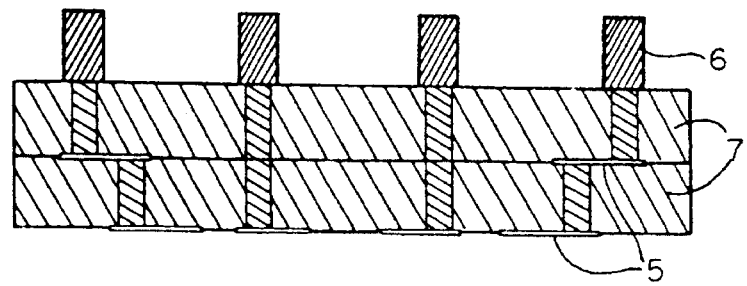
FIG. 4 is a cross sectional view of a laminated body made by sintering the laminated body of FIG. 3 and removing alumina therefrom.

The alumina layer of the green sheet for bump forming layer in the laminated body is not sintered at 900° C. Therefore, the unsintered alumina layer was completely removed by subjecting the sintered laminated body to ultrasonic cleaning in butylacetate solvent, thereby bumps were obtained. FIG. 4 shows a cross sectional view of the ceramic substrate with the alumina layer of the green sheet for bump forming layer having been removed. The ceramic substrate of this example has bump electrodes 6 for external connection being provided on the surface of the substrate 7 which has the wiring pattern 5.

Figure 5:
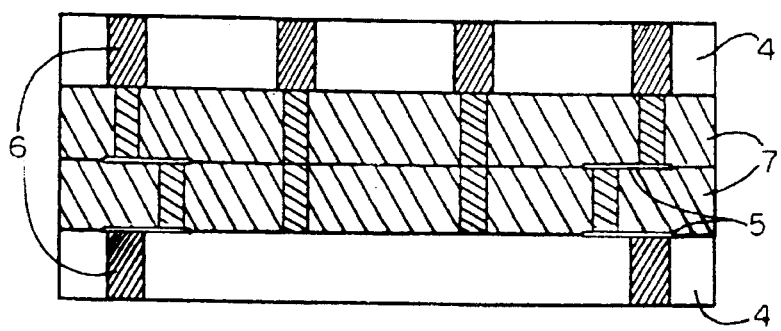
FIG. 5 is a cross sectional view of another laminated body used in the manufacture of the ceramic substrate of Example 1 of the invention.

While the bumps are formed on one side of the ceramic substrate in the above example, bumps may also be formed on both sides of the ceramic substrates. FIG. 5 shows a cross sectional view of a laminated body having green sheets for bump forming layer 4 on both sides of the substrate forming green sheet 7. A ceramic substrate having bumps on both sides can be obtained by sintering the laminated body shown in FIG. 5 and removing the alumina layer of the green sheet for bump forming layer.

Figure 6:
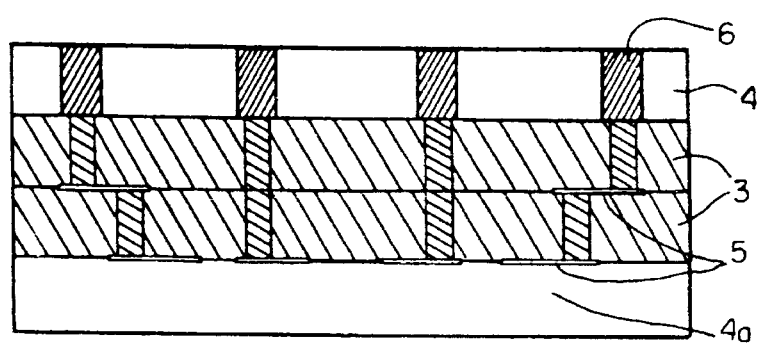
FIG. 6 is a cross sectional view of another laminated body used in the manufacture of the ceramic substrate of Example 1 of the invention.

By using a laminated body having such a structure that the substrate forming green sheet is interposed between a green sheet comprising only of alumina and a green sheet for bump forming layer, as shown in FIG. 6, deformation of the substrate such as warping can be prevented during the sintering process for forming bumps on one side of the ceramic substrate. FIG. 6 shows a cross sectional view of a laminated body used in the manufacture of the ceramic substrate obtained from this example. This laminated body has a substrate forming green sheet 3 between the green sheet for bump forming layer 4 and the green sheet 4a made of alumina only.

EXAMPLE 2

In this example, a bump forming layer was formed by using a paste for bump forming layer instead of the green sheet for bump forming layer of Example 1. First, a substrate forming green sheet was made similar to Example 1. A specified number of substrate forming green sheets whereon a wiring pattern was printed and via-holes were made were laminated and bonded by means of a thermo-compression bonding method, so as to obtain a laminated body of green sheets. Conditions of the thermo-compression bonding were a temperature of 80° C. and a pressure of 200 kg/cm². The substrate forming green sheet was about 200 μm thick.

Then the paste for bump forming layer was prepared, using alumina powder (ALM-41 with a mean particle size 1.9 μm, made by Sumitomo Chemical Co., Ltd.) as the inorganic component. With ethyl cellulose being added as the organic binder together with a vehicle dissolved in terpineol being added to the alumina powder, and mixing them to obtain an appropriate viscosity (30 Pa·s) by means of a 3-step roll, the paste for bump forming layer was obtained. The paste for bump forming layer was printed in order to form a bump forming layer having a plurality of holes therein onto one side of the laminated body of the substrate forming green sheet and the paste for bump forming layer was printed in a plain pattern on the other side of the laminated body of the substrate forming green sheet. A screen of 200 mesh and an emulsion thickness 30 μm were used in the double printing of the paste for bump forming layer. The paste for bump forming layer film thus obtained was about 100 μm thick.

Figure 7:
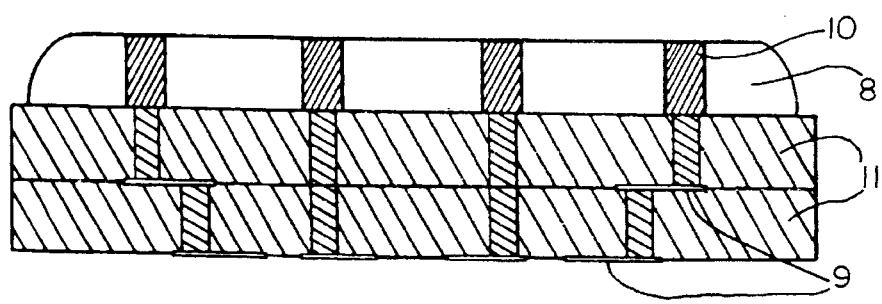
FIG. 7 is a cross sectional view of a laminated body after printing of alumina paste used in Example 2 of the invention.

The laminated body whereon the paste for bump forming layer was printed, was dried at 50° C. for 10 minutes. Then the holes formed by the paste for bump forming layer were filled with a conductive paste and dried at 50° C. for 10 minutes. FIG. 7 shows a cross sectional view of the laminated body obtained in this example. The laminated body has a layer of paste for bump forming layer 8, wiring pattern 9, bump electrodes 10 and a substrate forming ceramic green sheet layer 11. A part of the laminated body with the surface thereof not covered by the alumina paste was cut off so that the resultant laminated body was covered by the alumina paste over the entire surface thereof. This operation made the structure of the laminated body symmetrical and made it possible to suppress the deformation of the laminated body during the sintering process.

Then the laminated body was sintered in a belt furnace in an air atmosphere at 900° C. for one hour in order to obtain a sintered body. The temperature of 900° C. was maintained for about 12 minutes.

The alumina which is the main component of the paste for bump forming layer on the surface of the laminated body is not sintered at 900° C. Therefore, the bump forming layer was completely removed by subjecting the sintered laminated body to ultrasonic cleaning in butylacetate solvent, and bumps made of the sintered conductive paste were obtained.

EXAMPLE 3

In this example, the forming of the wiring pattern and the printing of the via-holes onto the green sheet were carried out by using CuO paste as a metal oxide paste. The substrate forming green sheet and the green sheet for bump forming layer were made similar to Example 1. The CuO paste for forming wiring was prepared by using an inorganic component made by adding 3 wt % of glass frit (LS-0803 glass powder with a mean particle size of 2.5 μm, made by Nippon Electric Glass Co., Ltd.) as an additive in order to increase the bonding strength to the CuO powder (mean particle size of 3 μm). Ethyl cellulose as the organic binder and a vehicle dissolved in terpineol were added to the inorganic component and mixed by means of a 3-step roll so as to obtain a proper viscosity, thereby to obtain the wiring forming CuO paste. The via-hole filling CuO Paste was prepared by further adding 15 wt % of the glass ceramic powder used in Example 1 to the wiring forming CuO paste. Holes were made in the green sheet for bump forming layer and the holes were filled with the via-hole filling CuO paste by the screen printing.

Specified numbers of the substrate forming green sheets and the bump forming green sheets were placed one on another so that the bump forming green sheet became the outermost layer, and were bonded by thermo-compression bonding to make a laminated body. Conditions of thermo-compression bonding were a temperature of 80° C. and a pressure of 200 kg/cm². The substrate forming green sheet and the green sheet for bump forming layer were about 200 μm thick.

The sintering process will now be described below. First the binder was removed from the green sheet and the metal oxide paste by applying heat treatment to the sheets. This binder removal process was carried out at 600° C. The organic binders included in the green sheet and in the CuO paste used in this example are PVB and ethyl cellulose which decompose at temperatures of 500° C. or higher in air.

For the reduction of the CuO paste, the laminated body which was processed to remove the binders was subjected to a reduction treatment in an atmosphere of 100% hydrogen gas at 200° C. for 5 hours. X-ray analysis of the CuO paste in the laminated body thus obtained indicated that 100% of the CuO was reduced to Cu. After the reducing process, the laminated body was sintered in a mesh belt furnace in a pure nitrogen atmosphere at 900° C.

The laminated body made, as described above, was subjected to ultrasonic cleaning in order to remove the bump forming layer similar to Example 1. As a result, bumps made by sintering of the reduced metal oxide forming paste could be formed.

EXAMPLE 4

In this example, the substrate forming paste and the paste for bump forming layer were used to form a substrate layer and a bump forming layer on the surface of the sintered ceramic substrate.

MLS-1 made by Nippon Electric Glass Co., Ltd. was used as the inorganic component of the substrate forming paste. This inorganic material was mixed with polyvinyl butyral as an organic binder, di-n-butyl phthalate as e plasticizer and toluene and isopropyl alcohol as solvents being in such a proportion that gave an appropriate viscosity, thereby to obtain the substrate forming paste. The paste for bump forming layer was prepared by using alumina powder (ALM-41 with a mean particle size 1.9 μm, made by Sumitomo Chemical Co., Ltd) as the inorganic component. With ethyl cellulose being added as the organic binder together with a vehicle dissolved in terpineol being added to the alumina powder, and mixing them to obtain an appropriate viscosity (30 Pa·s) by means of a 3-step roll, the paste for bump forming layer was obtained.

The CuO paste for forming wirings was prepared by using an inorganic component made by adding 3 wt % of glass frit (LS-0803 glass powder with a mean particle size of 2.5 μm, made by Nippon Electric Glass Co., Ltd.) as an additive in order to increase the bonding strength to the CuO powder (mean particle size of 3 μm). Ethyl cellulose as the organic binder and a vehicle dissolved in terpineol were added to the inorganic component and mixed by means of a 3-step roll to obtain a proper viscosity, thereby to obtain the wiring forming CuO paste. The via-hole filling CuO paste was prepared by further adding 15 wt % of the glass ceramic powder used in Example 1 to the wiring forming CuO paste.

The substrate layer and the bump forming layer were formed on the surface of the sintered ceramic substrate by using the substrate forming paste and the paste for bump forming layer. First, the substrate forming paste was spread over the surface of the sintered ceramic substrate, with via-holes being formed therein and dried. Wiring pattern printing by using the wiring forming paste and via-hole filling by using the via-hole filling paste were carried out on the dried substrate forming paste layer by means of screen printing.

A bump forming layer having a plurality of holes was printed by using the paste for bump forming layer onto the substrate forming paste whereon the wiring pattern forming and via-hole filling had been completed. After drying the paste for bump forming layer, the holes in the bump forming layer were filled with the via-hole filling CuO paste by means of screen printing.

The sintering process will now be described below. First the binder was removed from the substrate forming paste, the paste for bump forming layer and the CuO paste by applying heat treatment. This binder removal process was carried out at 600° C. The organic binders included in the substrate forming paste, the paste for bump forming layer and in the CuO paste are PVB and ethyl cellulose which decompose at temperatures 500° C. or higher in air.

For the reduction of the CuO paste, the laminated body which had been processed in order to remove the binders was subjected to reduction treatment in an atmosphere of 100% hydrogen gas at 200° C. for 5 hours. X-ray analysis of the CuO paste in the laminated body thus obtained indicated that 100% of the CuO was reduced to Cu. After the reducing process, the laminated body was sintered in a mesh belt furnace in a pure nitrogen atmosphere at 900° C. A mixture gas of hydrogen gas and nitrogen gas can be used for the reduction treatment.

The paste for bump forming layer was removed from the laminated body made in the process described above, by ultrasonic cleaning similar to Example 1. Consequently, bumps composed of sintered bodies of the reduced metal oxide forming paste could be formed.

While the substrate layer with a wiring pattern was formed by using the substrate forming paste on the ceramic substrate and sintered in this example, the substrate layer may also be formed by printing the substrate forming paste onto the substrate forming green sheet and sintering the substrate layer at the same time as the substrate forming green sheet is sintered.

EXAMPLE 5

Figure 9:
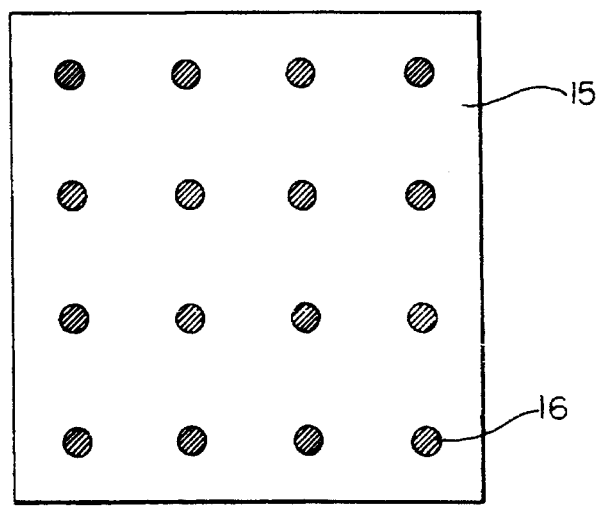
FIG. 9 is a view showing the back face of a ceramic substrate of Example 5 of the invention.

A substrate having conductive bumps was made in the manufacturing method of Example 1 by using a green sheet for bump forming layer 0.2 mm thick. FIG. 9 shows a view of the back face of a ceramic substrate of this example. The bump electrodes 16 were formed in a grid configuration with 1.27 mm pitch on the bottom surface of the ceramic substrate 15, with the conductive bumps whose heights were uniform at about 0.2 mm.

Figure 8:
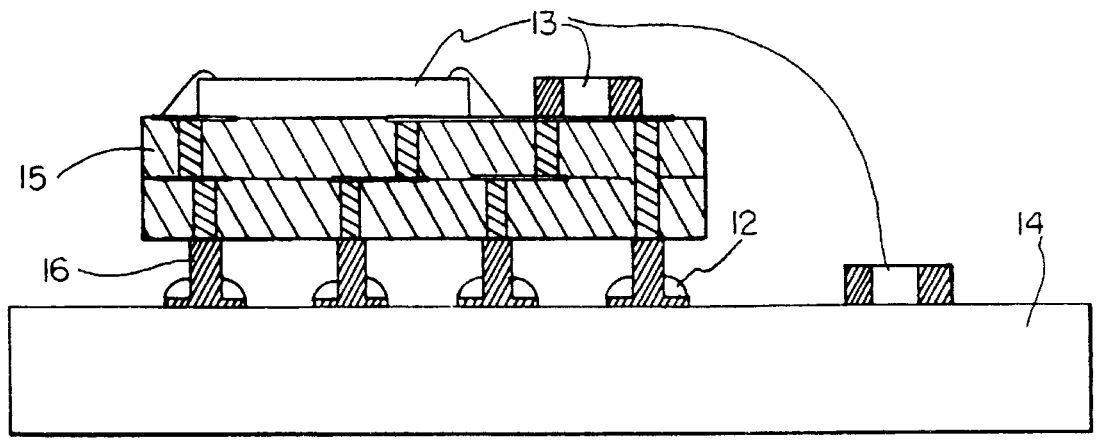
FIG. 8 is a cross sectional view of a ceramic substrate, having protruding electrodes made of an electrically conductive material, being mounted on a printed circuit board in Example 5 of the invention.

The ceramic substrate having the conductive bumps described above was mounted on a printed circuit board (FR-4) by soldering so that the bumps on the ceramic substrate were connected to the electrode pad on the printed circuit board. Solder paste was printed onto the electrode pad on a printed circuit board by means of screen printing. After arranging the ceramic substrate so that the bumps of the ceramic substrate were connected to the electrode pad on the printed circuit board, a reflowing of the solder was carried out in a nitrogen atmosphere at 230° C. in order to establish the connection. FIG. 8 shows a cross sectional view of the structure of the printed circuit board 14 whereon the ceramic substrate 15 having the bump electrodes 16 is mounted thereon. The ceramic substrate has electronic devices 13 being mounted thereon in advance. The ceramic substrate 15 is mounted on the printed circuit board 14 via the bump electrodes 16 by using the solder 12.

As described above, the ceramic substrate of the invention was mounted on the printed circuit board and the occurrence of a solder bridge in the solder section was evaluated. Solder bridges occurred between the electrodes which were arranged near to each other were zero among 1000 points. This means that connection having a very high reliability without solder bridge can be obtained by using the ceramic substrate of the invention.

Although $Al_2O_3$ was used as the non-sintered material of the green sheet for bump forming layer and the paste for bump forming layer in the above embodiments, BeO, MgO, $ZrO_2$, $TiO_2$ and BN could also be used.

The ceramic substrate of the invention has bump electrodes of the same height, and the bumps can be made high enough to prevent the occurrence of solder bridge. Increasing the height of the bump electrodes is also effective in suppressing the breakage of joints due to thermal stress generated between the printed circuit board and the ceramic substrate. Moreover, since the plurality of bumps have uniform heights, connection failure between the ceramic substrate and the printed circuit board can be reduced. Height of the bump electrodes can be controlled by regulating the thickness of the green sheet for bump forming layer, or the thickness of the paste for bump forming layer film. Moreover, since the bump electrodes can be formed at the same time as the ceramic substrate is made with this method of manufacturing the ceramic substrate of the invention, a ceramic substrate having bump electrodes can be made at a low cost. It is a matter of course that the ceramic substrate having bump electrodes of this invention can be used not only as a multi-chip substrate but also as a chip carrier.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of manufacturing a ceramic substrate having a plurality of bumps comprising the steps of:
   forming a bump forming layer having a plurality of holes therein on at least one of upper and lower faces of a laminated body of green sheets;
   filling the holes in the bump forming layer with a bump forming paste;
   sintering the laminated body of the green sheets and the bump forming paste wherein the bump forming layer is not sintered; and
   forming bumps made of the sintered bump forming paste by removing the bump forming layer.

2. A method according to claim 1, wherein the step of forming the bump forming layer comprises the steps of:
   making the plurality of holes in at least one green sheet for bump forming layer; and
   applying the at least one green sheet for bump forming layer onto the at least one face of the laminated body of green sheets.

3. A method according to claim 2, wherein the green sheet for bump forming layer includes inorganic components as major components.

4. A method according to claim 2, wherein the green sheet for bump forming layer includes at least one component selected from a group consisting of $Al_2O_3$, MgO, $ZrO_2$, $TiO_2$, BeO and BN.

5. A method according to claim 1, further comprising, before the sintering step, the steps of:
   applying heat treatment to the laminated body of green sheets and the bump forming paste in order to remove organic substances included in the laminated body of green sheets and the bump forming paste; and reducing the bump forming paste.

6. A method according to claim 1, wherein the step of forming the bump forming layer comprises the step of:

printing the bump forming layer having the plurality of holes therein on the at least one face of the laminated body of green sheets by using a paste for bump forming layer.

7. A method according to claim 6, further comprising, before the sintering step, the steps of:

applying heat treatment to the laminated body of green sheets, the bump forming paste and the paste for bump forming layer in order to remove organic substances included in the laminated body of green sheets, the bump forming paste and the paste for bump forming layer; and reducing the bump forming paste.

8. A method according to claim 6, further comprising, before the step of forming the bump forming layer, the step of forming a substrate forming layer on at least one face of the laminated body of green sheets by printing a paste for forming substrate.

9. A method according to claim 6, wherein the paste for bump forming layer includes inorganic components as major components.

10. A method according to claim 6, wherein the paste for bump forming layer includes at least one component selected from a group consisting of $Al_2O_3$, MgO, $ZrO_2$, $TiO_2$, BeO and BN.

11. A method according to claim 1, wherein the bump forming paste is a conductive paste including at least one component selected from a group consisting of Ag, Pd, Pt and Cu.

12. A method according to claim 1, wherein the bump forming paste is a metal oxide paste including CuO as the major component.

13. A method according to claim 1, wherein the plurality of bumps each have a form of a pillar.

14. A method of manufacturing a ceramic substrate having a plurality of bumps comprising the step of:

forming a bump forming layer having a plurality of holes therein on at least one of upper and lower faces of a ceramic substrate;

filling the holes in the bump forming layer with a bump forming paste; sintering the ceramic substrate and the bump forming paste wherein the bump forming layer is not sintered; and forming bumps made of the sintered bump forming paste by removing the bump forming layer.

15. A method according to claim 14, wherein the step of forming the bump forming layer comprises the steps of:

making the plurality of holes in at least one green sheet for bump forming layer; and applying the at least one green sheet for bump forming layer onto the at least one face of the ceramic substrate.

16. A method according to claim 15, further comprising, before the sintering step, the steps of:

applying heat treatment to the green sheet for bump forming layer and the bump forming paste in order to remove organic substances included in the green sheets for bump forming layer and the bump forming paste; and reducing the bump forming paste.

17. A method according to claim 15, wherein the green sheet for bump forming layer includes inorganic components as major components.

18. A method according to claim 15, wherein the green sheet for bump forming layer includes at least one component selected from a group consisting of $Al_2O_3$, MgO, $ZrO_2$, $TiO_2$, BeO and BN.

19. A method according to claim 14, wherein the step of forming the bump forming layer comprises the step of:

printing the bump forming layer having a plurality of holes therein on the at least one face of the ceramic substrate by using a paste for bump forming layer.

20. A method according to claim 19, further comprising, before the step of forming the bump forming layer, the step of forming a substrate forming layer on at least one face of the ceramic substrate by printing a paste for forming substrate.

21. A method according to claim 19, wherein the paste for bump forming layer includes inorganic components as major components.

22. A method according to claim 19, wherein the paste for bump forming layer includes at least one component selected from a group consisting of $Al_2O_3$, MgO, $ZrO_2$, $TiO_2$, BeO and BN.

23. A method according to claim 19, further comprising, before the sintering step, the steps of:

applying heat treatment to the bump forming paste and the paste for bump forming layer in order to remove organic substances included in the bump forming paste and the paste for bump forming layer; and reducing the bump forming paste.

24. A method according to claim 14, wherein the bump forming paste is a conductive paste including at least one component selected from a group consisting of Ag, Pd, Pt and Cu.

25. A method according to claim 14, wherein the bump forming paste is a metal oxide paste including CuO as the major component.

26. A method according to claim 14, wherein the plurality of bumps each have a form of a pillar.

* * * * *